United States Patent [19]
Pease et al.

[11] Patent Number: 5,546,260

[45] Date of Patent: Aug. 13, 1996

[54] PROTECTION CIRCUIT USED FOR DEACTIVATING A TRANSISTOR DURING A SHORT-CIRCUIT HAVING AN INDUCTIVE COMPONENT

[75] Inventors: Robert A. Pease, San Francisco, Calif.; Robin Shields, Inverclyde, Scotland

[73] Assignee: National Semiconductor Corporation, Santa Clara, Calif.

[21] Appl. No.: 550,523

[22] Filed: Oct. 30, 1995

Related U.S. Application Data

[63] Continuation of Ser. No. 281,346, Jul. 27, 1994, abandoned, which is a continuation of Ser. No. 2,044, Jan. 8, 1993, abandoned.

[51] Int. Cl.⁶ .................................................. H02H 7/00
[52] U.S. Cl. .................. 361/18; 361/86; 361/91
[58] Field of Search .............................. 361/18, 86, 91

[56] References Cited

U.S. PATENT DOCUMENTS

| | | | |
|---|---|---|---|
| 3,577,087 | 5/1971 | Martin et al. | 328/110 |
| 3,609,705 | 9/1977 | Mercy | 307/238 |
| 3,751,683 | 8/1973 | Drost | 307/218 |
| 3,787,737 | 1/1974 | Mukai | 307/215 |
| 3,906,310 | 9/1975 | Esashika | 361/18 |
| 4,338,646 | 7/1982 | Davis et al. | 361/18 |

(List continued on next page.)

FOREIGN PATENT DOCUMENTS

| | | | |
|---|---|---|---|
| 0483450A1 | 5/1992 | European Pat. Off. | H03K 17/08 |
| 0483449A1 | 5/1992 | European Pat. Off. | H03K 17/60 |
| 0492375A1 | 7/1992 | European Pat. Off. | H02H 7/20 |
| 1926057 | 11/1969 | Germany | H03K 19/082 |
| 1948202 | 4/1971 | Germany | H03K 19/082 |
| 0111028A2 | 6/1984 | Germany | H03K 17/08 |
| 0166125A1 | 1/1986 | Germany | H03K 17/945 |
| 3928225A1 | 3/1990 | Germany | H02H 3/08 |
| 4142666A1 | 7/1993 | Germany | H03K 17/08 |
| 1252795 | 11/1971 | United Kingdom | H03K 19/08 |
| WO-A-91/15058 | 10/1991 | WIPO | H03K 17/08 |

OTHER PUBLICATIONS

Robert Allen Pease, "Declaration Of Robert Allen Pease Under 37 C.F.R. § 1.68", dated Nov. 4, 1994, pp. 1–6.

Robin Shields, "Declaration Of Robin Shields Under 37 C.F.R. § 1.68", dated Oct. 30, 1994, pp. 1–6.

U.S. Patent Application Serial No. 07/903,793, filed Jun. 24, 1992, title believed to be "A Circuit Design Having a Semiconductor Switch for Switching a Load", inventor believed to be Walter Kares, current status unknown, all pages.

*Primary Examiner*—Todd DeBoer
*Attorney, Agent, or Firm*—Limbach & Limbach

[57] ABSTRACT

A protection circuit for a semiconductor switch for switching a load is disclosed. Control circuitry is used for switching the semiconductor switch on in response to a switching signal and for switching the semiconductor switch off in response to a deactivation signal. A deactivation circuit is used for generating the deactivation signal. An overvoltage detector circuit responsive to a voltage at an output of the semiconductor switch that exceeds a predetermined value is used for generating an overvoltage signal. The overvoltage detector circuit includes a Zener diode that has its cathode coupled through a resistor to the output of the semiconductor switch and its anode coupled to the collector of the diode connected transistor. A first logic circuit is used for causing the deactivation circuit to generate the deactivation signal in response to the switching signal and the overvoltage signal. The first logic circuit includes a first npn transistor that has its base coupled through a resistor to receive the switching signal. A second npn transistor receives the overvoltage signal through a resistor at its base. The collector of the first npn transistor is coupled to the collector of the second npn transistor. A third npn transistor has its base coupled to the collector of the second npn transistor. A first pnp transistor has its base coupled to the collector of the third npn transistor. One of the two collectors is coupled to the deactivation circuit.

13 Claims, 4 Drawing Sheets

U.S. PATENT DOCUMENTS

| | | | |
|---|---|---|---|
| 4,355,245 | 10/1982 | Isogai | 307/455 |
| 4,441,136 | 4/1984 | Hampshire | 361/88 |
| 4,480,319 | 10/1984 | Hotta et al. | 365/155 |
| 4,567,537 | 1/1986 | Kalkhof et al. | 361/18 |
| 4,678,942 | 7/1987 | Kanai et al. | 307/455 |
| 4,827,158 | 5/1989 | Matsumura | 307/270 |
| 4,877,977 | 10/1989 | Kokado | 307/455 |
| 4,962,350 | 10/1990 | Fukuda | 323/283 |
| 5,119,263 | 6/1992 | Gariboldi et al. | 361/18 |
| 5,210,481 | 5/1993 | Brambilla et al. | 323/316 |

PROTECTION CIRCUIT USED FOR DEACTIVATING A TRANSISTOR DURING A SHORT-CIRCUIT HAVING AN INDUCTIVE COMPONENT

This is a continuation of application Ser. No. 08/281,346 filed on Jul. 27, 1994, which is a continuation of application Ser. No. 08/002,044 filed on Jan. 8, 1993, both now abandoned.

BACKGROUND OF THE INVENTION

1. Field of the Invention

The present invention relates to protection circuits for power transistors, and more particularly, to protection circuits used to deactivate a transistor in the event of a short-circuit in the output of the transistor that has an inductive component.

2. Description of the Related Art

Large power transistors are often used for switching loads. For example, a power transistor may be used for connecting a load to ground potential in order to draw current through the load. Such uses of power transistors are common in automotive electrical systems.

One, two, or several power transistors are typically integrated into a single semiconductor chip. One of the inputs on such a chip receives a digital switching signal that is used for activating and deactivating the power transistor, i.e., switching it on and off. The main output of such a chip is typically the collector of the power transistor. This output is normally connected to the load.

The emitter of the power transistor is coupled to ground internally within the chip, and the base is normally coupled to some type of main activation and deactivation circuitry that is at least partially controlled by the switching signal to activate and deactivate the power transistor.

Although theoretically the power transistor will function properly if connected to the proper load, there is always the practical danger that the output of the chip, i.e., the collector of the power transistor, will accidentally be short-circuited by connecting it directly to a power source. Various protection circuits have been devised in the prior art to guard against such short-circuiting. Such protection circuits typically include some type of deactivation circuit that deactivates the power transistor, i.e., turns it off, in the event of a short-circuit.

It has been found, however, that typical short-circuit protection circuits will not protect a power transistor from a short-circuit having an inductive component caused by five to ten or more feet of wire. Such short-circuits are common in automotive applications where cables having lengths of five to ten feet are frequently employed.

Thus, there is a need for a protection circuit that will deactivate a power transistor when its output is shorted to a power source with five to ten or more feet of wire.

OBJECTS AND SUMMARY OF THE INVENTION

An object of this invention is to ensure that reliable deactivation occurs during a short circuit caused by a length of wire.

The present invention provides a protection circuit for a semiconductor switch for switching a load that includes control circuitry for switching the semiconductor switch on in response to a switching signal and for switching the semiconductor switch off in response to a deactivation signal. A deactivation circuit is used for generating the deactivation signal. An overvoltage detector circuit responsive to a voltage at an output of the semiconductor switch that exceeds a predetermined value is used for generating an overvoltage signal. The overvoltage detector circuit includes a resistor, a diode connected transistor, and a Zener diode. The Zener diode has its cathode coupled through the resistor to the output of the semiconductor switch and its anode coupled to the collector of the diode connected transistor. The overvoltage signal is generated at the emitter of the diode connected transistor. A first logic circuit is used for causing the deactivation circuit to generate the deactivation signal in response to the switching signal and the overvoltage signal. The first logic circuit includes a first npn transistor having its emitter connected to ground and its base coupled through a resistor to receive the switching signal. A second npn transistor having its collector coupled through a resistor to its base and its emitter connected to ground receives the overvoltage signal through a resistor at its base. The collector of the first npn transistor is coupled to the collector of the second npn transistor. A third npn transistor has its emitter coupled through a resistor to ground and its base coupled to the collector of the second npn transistor. A first pnp transistor having two collectors has its base coupled to the collector of the third npn transistor. The emitter of the first pnp transistor is coupled to a positive voltage supply and a first of the two collectors is coupled to the base of the first pnp transistor. A second of the two collectors is coupled to the deactivation circuit.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

Identical parts in the figures have the same designations.

DETAILED DESCRIPTION OF THE PREFERRED EMBODIMENTS

Figure 1:
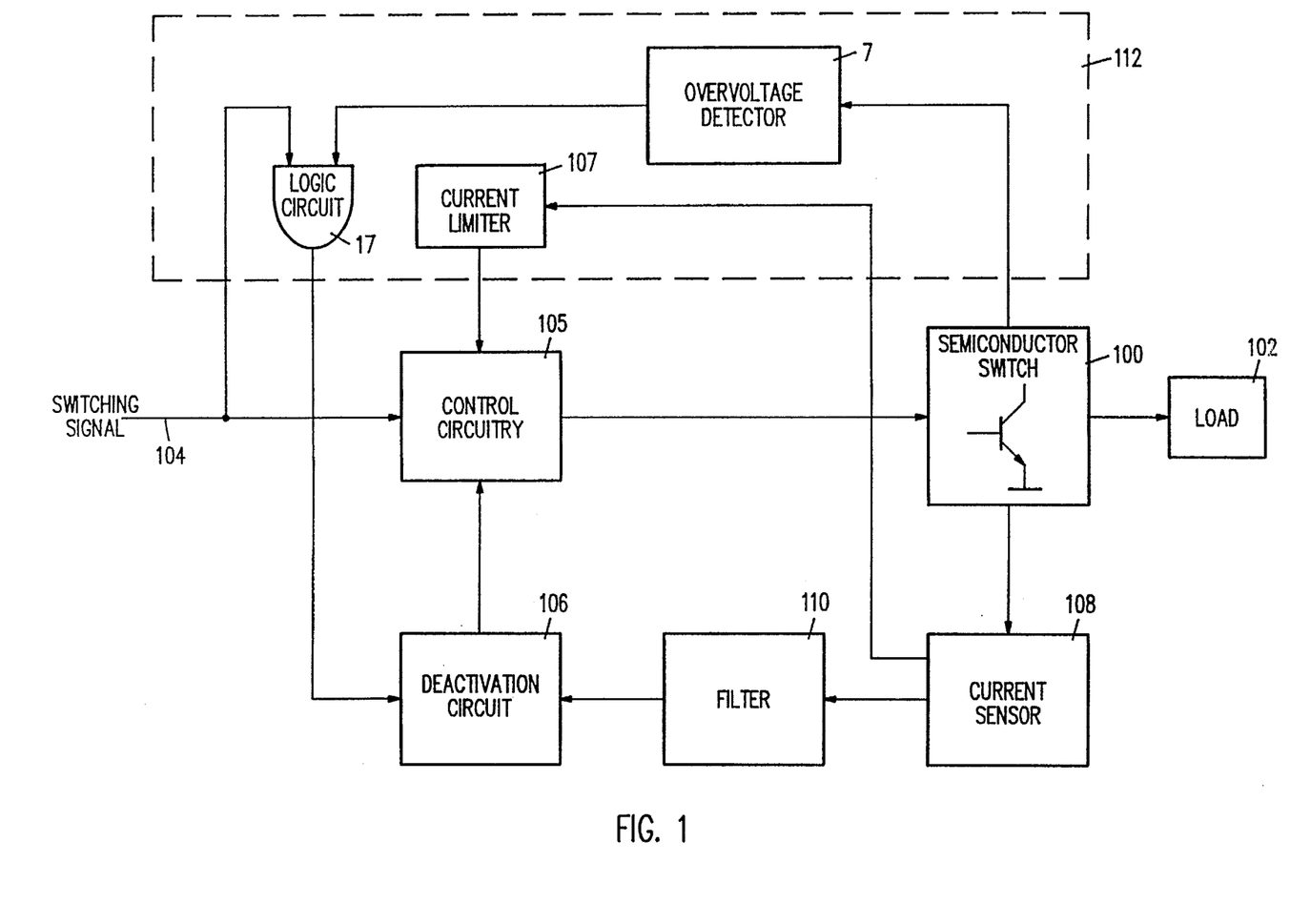
FIG. 1 is a block diagram illustrating a protection circuit in accordance with the present invention.

FIG. 1 shows a circuit design having a semiconductor switch 100 for switching a load 102, in particular an actuator in open-loop or closed-loop control equipment. Switching occurs as a function of a switching signal supplied via line 104 and main activation and deactivation circuitry 105 using a deactivation circuit 106 for deactivating the switch 100 during a short circuit. The deactivation circuit 106 is controlled by a current sensor 108 via a filter 110.

Such circuit designs are used particularly if the load 102 is connected to the semiconductor switch 100 via cables, for example, in the engine compartment of a motor vehicle. In such a case, a short circuit cannot be ruled out because of the severe operating conditions that can occur in that environment. However, the deactivation circuit 106 is controlled by way of the filter 110 because brief current spikes must not cause deactivation of the switch 100. These circuit designs include current limiters, so that the current is limited until deactivation during a short circuit. In the event of a very rapid increase in current, the current is initially limited by the characteristics of the transistor used as the semiconductor switch 100 before limiting starts.

It is believed that a short-circuit caused by five to ten or more feet of wire does not activate typical protection circuits because of the inductive component present in such a short-circuit. If the load seen during a short circuit contains an inductive component, which may fall in the range of 4 to 10 micro-Henry, the decrease in current brought about by the control circuitry 105 causes a voltage spike. This spike may destroy the semiconductor switch 100 or temporarily trigger an overvoltage deactivation device, if present. Once the voltage spike has passed, the semiconductor switch 100 is activated again so that, if the short circuit is still present, a new voltage spike is created. The filter 110 connected between the current sensor 108 and the deactivation circuit 106 prevents the output voltage spike of the current sensor 108 caused by this oscillation from triggering the deactivation circuit 106. The lack of deactivation, that is necessary in theory, may lead to destruction of the semiconductor switch 100.

An object of this invention is to ensure that reliable deactivation occurs during a short circuit even with an inductive component. This object is achieved by the short-circuit protection circuitry 112 shown in FIG. 1.

Specifically, as shown in FIG. 1, the deactivation device 106 is controlled via a logic circuit 17. This control is provided by the switching signal and by the output signal from an overvoltage detector 7 at the semiconductor switch 100 such that deactivation occurs if a specified overvoltage is present and the switching signal reaches a level set for activation. In one exemplary embodiment of this invention, the logic circuit 112 includes an AND circuit that triggers the deactivation circuit 106 if both the switching signal for activation and the output signal from the overvoltage detector 7 are simultaneously "active" high.

The short-circuit protection circuitry 112 of this invention has the advantage that, when the semiconductor switch 100 is activated, overvoltages are recognized as overvoltages caused by a short circuit with an inductive load and result in immediate deactivation.

The present invention allows several embodiments. Two of these embodiments are shown schematically in FIGS. 2 and 3 and are described below.

Figure 2:
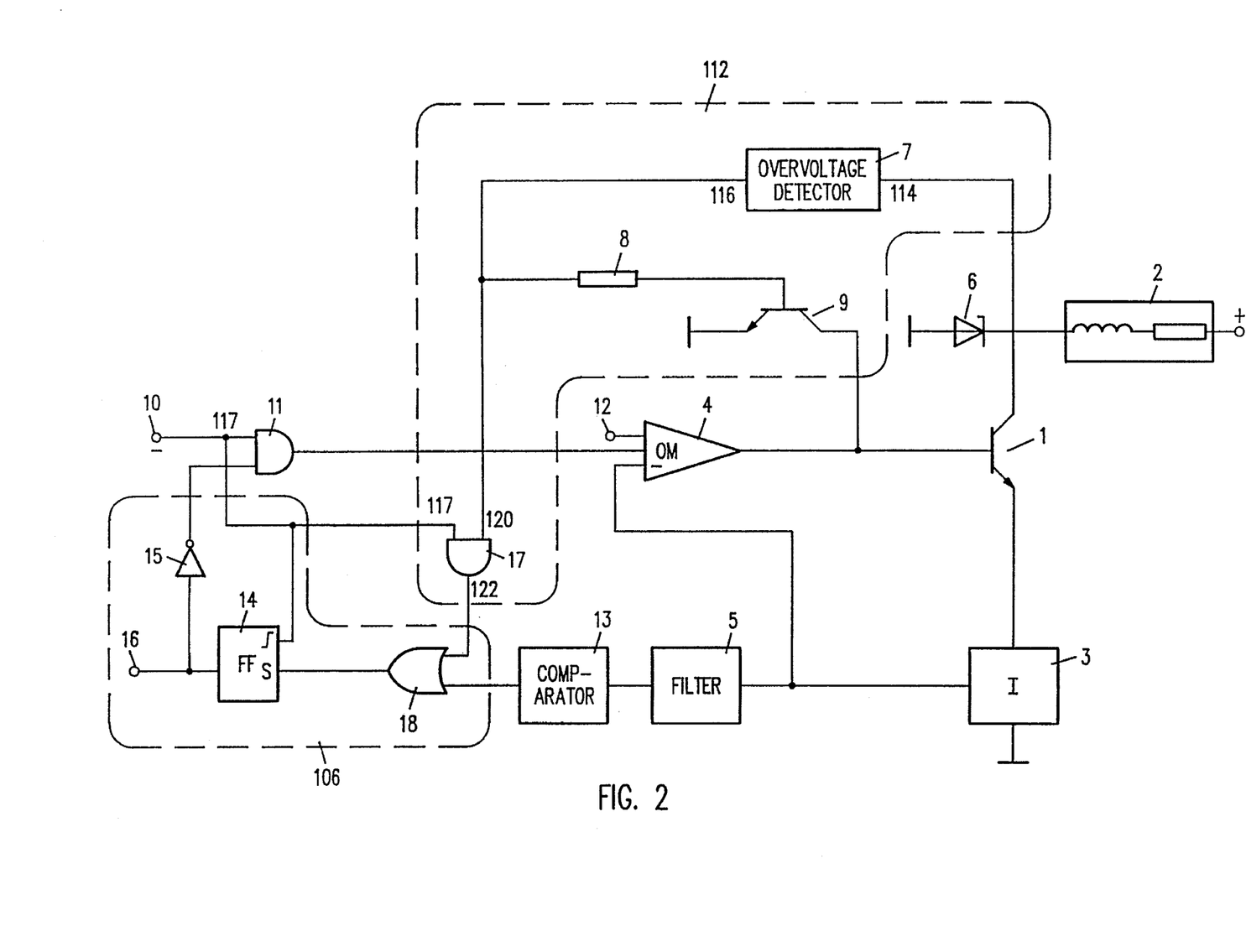
FIG. 2 is a schematic diagram illustrating one embodiment of the FIG. 1 protection circuit.

FIG. 2 shows a logic circuit 11 in the signal path between the switching signal and a control electrode of the semiconductor switch 1. This logic circuit 11 interrupts the switching signal to the control electrode of switch 1 when the deactivation device 106 is activated.

In the circuit design of FIG. 2, the emitter-collector path of a switch transistor 1 is connected in series with a load 2. The load 2 is connected to the positive terminal of an operating voltage supply (not shown). Current sensor 3 is coupled to the emitter of transistor 1. Current sensor 3 produces a voltage corresponding to the emitter current. This voltage is applied both to the inverting input of current limiter 4 and to the input of filter 5. The collector-emitter path of switch transistor 1 is connected in parallel with Zener diode 6. The diode 6 clamps voltage spikes that are far too high. Further, an overvoltage detector 7 is connected to the collector of transistor 1. The output voltage of overvoltage detector 7 reaches a level of 1 ("HIGH") when the collector voltage exceeds a specified value. As used below, the term "overvoltage signal" refers to the output voltage of the overvoltage detector 7.

The overvoltage signal, which is applied to the base of npn transistor 9 via resistor 8, causes transistor 9 to conduct as soon as the collector voltage of switch transistor 1 has exceeded the specified value. In this way, since the collector of transistor 9 is connected to the base of switch transistor 1, the base of transistor 1 is depleted, a prerequisite for using the permissible voltage range of transistor 1.

To control activation and deactivation of the switch transistor 1, a switching signal is fed to one input 10. This signal reaches a positive level for activation. In the example, this level has been assigned to logic 1 level. During normal operation, the switching signal is applied to an input of current limiter 4 by way of AND gate 11. From current limiter 4, the signal is fed to the base of transistor 1. This signal is at the level necessary for complete conduction if the output voltage of current sensor 3 has not reached a level to cause current limiting. In addition, a reference voltage specifying the maximum current is fed to current limiter 4 by way of another input 12.

To deactivate transistor 1 in case of a short circuit, the output voltage of filter 5 is fed to comparator 13. The output signal of comparator 13 reaches logic 1 level when the current exceeds a specified limit. In circuit designs of prior art, the output signal of comparator 13 is fed directly to a deactivation device consisting of flip-flop 14 and inverter 15. Flip-flop 14 is reset, if it had been set previously, by a rapid increase in the voltage of the switching signal at input 10. In the event of a short circuit, the output signal of comparator 13 sets flip-flop 14 such that the output voltage of the flip-flop reaches logic 1 level. This output voltage interrupts the connection of the switching signal to the current limiter 4 by way of inverter 15 and AND gate 11. In addition, a signal indicating short-circuit deactivation can be taken from output 16.

To ensure deactivation during a short circuit even with an inductive load, the overvoltage signal is fed to one input of another AND gate 17. The switching signal is applied to the other input of AND gate 17. The output of AND gate 17 is connected to one input of OR gate 18. OR circuit 18 is connected in the signal path between comparator 13 and the SET input of flip-flop 14. During the turn-on time of transistor 1, the switching signal at input 10 is at the 1 level. If a short circuit occurs during this time, it causes a voltage spike due to the inductive component of the short-circuit load. Flip-flop 14 is then set by way of AND gate 17 and OR gate 18 because of the overvoltage signal that is also at the 1 level. Flip-flop 14, in turn, causes the transistor 1 to switch off by way of inverter 15 and AND gate 11.

Figure 3:
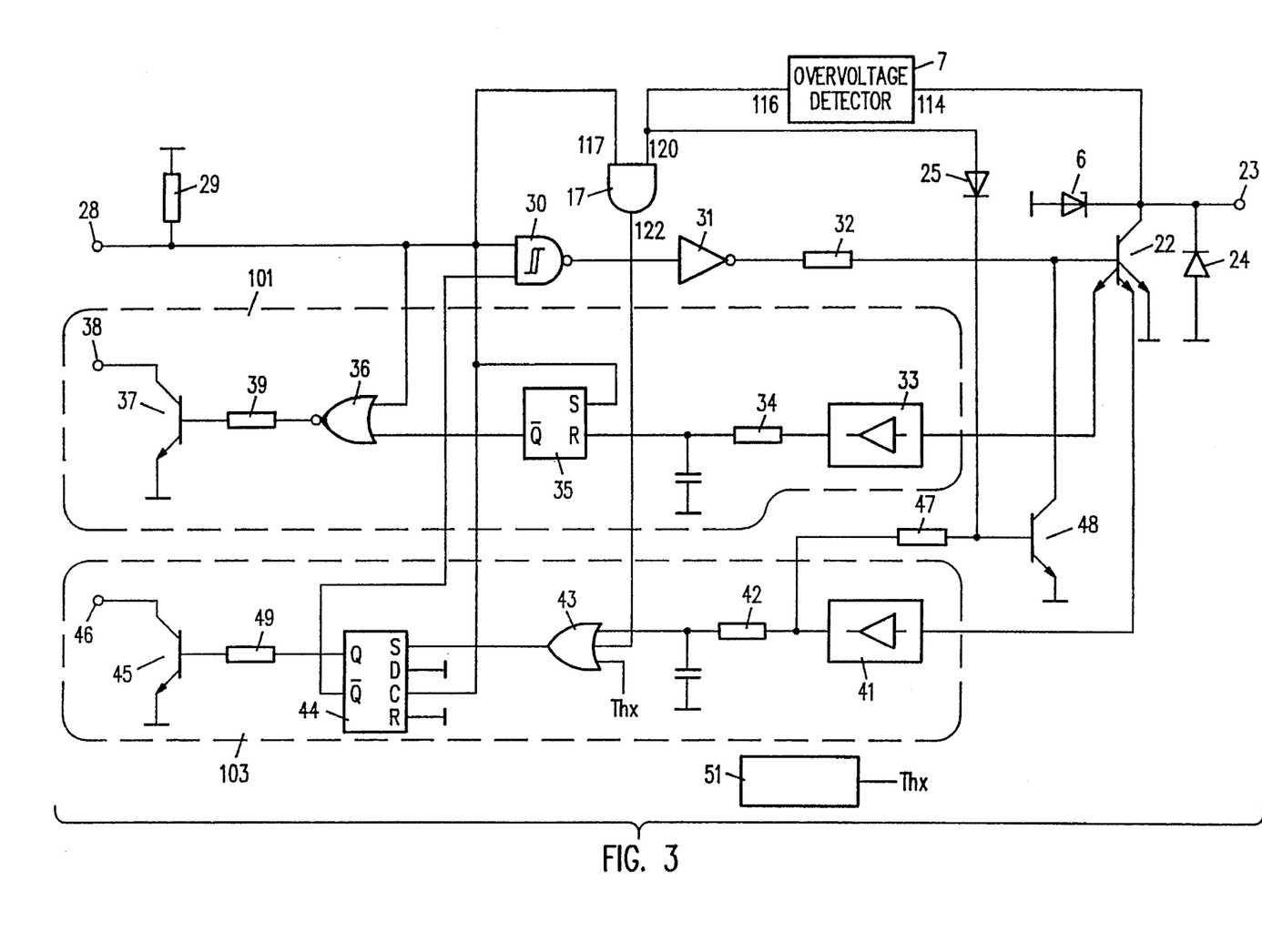
FIG. 3 is a schematic diagram illustrating another embodiment of the FIG. 1 protection circuit.

FIG. 3 shows a practical implementation of the above-described concepts. In this figure, a multi-emitter transistor 22 forms the power switch. One emitter of transistor 22 is coupled to ground and the collector is connected to output 23. A reverse-connection protect diode 24 and Zener diode 6 are connected in parallel to protect transistor 22 against overvoltages because the circuit is designed essentially to switch inductive loads.

A switching signal for transistor 22 is supplied via input 28. This input is connected to ground through input resistor 29. The switching signal reaches the base of transistor 22 by way of the series-connected NAND gate 30, inverting amplifier 31 and resistor 32.

An open-circuit monitor 101 and a short-circuit monitor 103 are provided to detect faults on output 23. The open-circuit monitor 101 responds if the current through transistor 22 drops below a specified threshold. Thus, it responds in case of a cable break between the collector of transistor 22 and the load, or a cable break within the load, or a cable break between the load and the positive operating voltage. In addition, the open-circuit monitor reacts in the event of a short circuit of output 23 to ground.

The short-circuit monitor 103 responds when the current through transistor 22 exceeds a specified value. This is primarily the case in the event of a short between output 23 or the cable to the load on the one side and the positive terminal of the operating voltage source on the other.

The open-circuit monitor 101 includes a threshold circuit 33, a low-pass filter 34, a flip-flop 35, NOR gate 36, and an npn output transistor 37. A signal indicating an open circuit, for example, a cable break, can be taken from output 38.

Threshold circuit 33 produces an output signal that becomes positive if the current flowing through transistor 22 exceeds a specified value. This specified value lies below the current expected for the load. Tolerances of the individual loads, fluctuations over time and thermal changes must be considered. Transient disturbances are suppressed by low-pass filter 34 that has a time constant of 200 µs, for example.

Flip-flop 35 is set at the beginning of a control pulse used to drive transistor 22 into the conducting state. Then, the value 0 ("LOW") is present at output $\overline{Q}$. This signal is fed to NOR gate 36 with the control signal that has a value of 1 at this time. This creates a 0 signal at the output of the NOR gate 36, driving the transistor 37 into the off state by way of resistor 39. In this manner, output 38 reaches the 1 level.

If, while transistor 22 is conducting, the current increases over the threshold, flip-flop 35 is reset. At the end of the conducting phase, the control signal reaches the 0 value so that the signal at output 38 is a function of the level at the output $\overline{Q}$ of flip-flop 35 because of NOR gate 36. The 1 level is present at output $\overline{Q}$ because flip-flop 35 has been reset. In this way, transistor 37 still does not conduct and the 1 level is present at output 38.

However, if the current through transistor 22 has not exceeded the specified value during the conducting phase, flip-flop 35 remains set so that output $\overline{Q}$ continues carrying the 0 level. This causes transistor 37 to be driven so that the 0 level appears at output 38 as a fault indication.

The short-circuit monitor 103 consists of a threshold circuit 41, a low-pass filter 42, OR gate 43, flip-flop 44 and an npn output transistor 45. The collector of transistor 45 forms an output 46. The output signal from threshold circuit 41 jumps to a positive value if the current through transistor 22 exceeds the current expected during normal operation. Low-pass filter 42 suppresses brief disturbances. To form a current limiter, the base of transistor 48 is connected to the output of the threshold circuit 41 via resistor 47. Transistor 48, with resistor 32 as a dropping resistor, reduces the voltage at the base of transistor 22 during a short circuit, thereby limiting the current to a value that does not overload the transistor and is enough to set flip-flop 44 being clocked by the control signals. In addition, transistor 48 can be driven into the conducting state by the overvoltage signal by way of diode 25 to deplete the base of transistor 22.

Transistor 45 is connected to output Q of flip-flop 44 by way of resistor 49. Setting flip-flop 44 causes transistor 45 to conduct so that output 46 reaches the 0 level in the event of a short circuit. At the same time, connecting output $\overline{Q}$ of flip-flop 44 to NAND gate 30 interrupts the control signals to transistor 22 until the switching signal at input 28 again changes from the 0 level to the 1 level. This resets flip-flop 44 again.

Temperature sensor 51 is also provided. This sensor outputs the signal Thx that takes on the 1 value if a permissible temperature is exceeded. This signal is fed to OR gate 43 triggering a short-circuit fault indication.

As in the circuit design of FIG. 1, in order to ensure deactivation during a short circuit having an inductive component, the switching signal and the overvoltage signal are fed to AND gate 17. The output of AND gate 17 is connected to a third input of OR gate 43. The output of OR gate 43 is connected to the set input of flip-flop 44.

The purpose of AND gate 17 is to ensure that flip-flop 44 is set by overvoltage detector 7 only in cases of severe current overload or current limit. These cases occur only when both node 116 of the overvoltage detector 7 and the switching signal at node 28 are simultaneously at HIGH levels. AND gate 17 prevents flip-flop 44 from being set when the overvoltage detector 7 is at a HIGH level and the switching signal at node 28 is at a LOW level.

For example, at the end of every cycle when the switching signal at node 28 goes LOW in order to switch off the semiconductor switch 22, the output voltage at node 23 increases to a very high voltage. This increase in voltage at the end of every cycle, i.e., when the switching signal at node 28 goes LOW, is a normal occurrence and is not a case in which deactivation should occur. However, when the output voltage at node 23 increases to this high level, node 116 of the overvoltage detector 7 goes to a HIGH level. If node 116 were connected directly to flip-flop 44 without AND gate 17, deactivation would occur at the end of every cycle, an undesirable result. Instead, AND gate 17 permits flip-flop 44 to be set only when the overvoltage detector 7 and the switching signal at node 28 are both at HIGH levels. Thus, deactivation will not occur during normal increases in voltage at node 23 when the switching signal at node 28 goes LOW.

Figure 4:
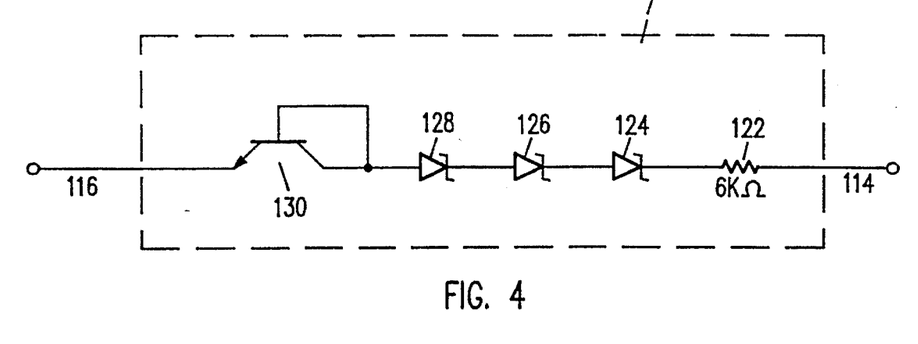
FIG. 4 is a schematic diagram illustrating an overvoltage detector shown in FIGS. 1–3.

FIG. 4 shows an example of detailed circuitry for implementing overvoltage detector circuit 7 of FIGS. 1 through 3. The overvoltage detector circuit 7 is responsive to a voltage at the output of the semiconductor switch that exceeds a predetermined value for generating an overvoltage signal. Normally, the predetermined voltage is approximately 24 Volts. Specifically, three series-connected 8 Volt Zener diodes 124, 126, and 128 are coupled through a 6 KΩ resistor 122 to the output of the semiconductor switch at node 114. The cathode of Zener diode 128 is connected to the anode of Zener diode 126, the cathode of Zener diode 126 is connected to the anode of Zener diode 124, and the cathode of Zener diode 124 is connected to the resistor 122. A diode-connected transistor 130 has its collector connected to the anode of Zener diode 128. The overvoltage signal is generated at the emitter of the diode-connected transistor 130.

During operation, if the voltage at the output of the semiconductor switch (node 114) becomes greater than 24 Volts, the three Zener diodes 124, 126, and 128 begin to conduct and current flows through them from cathode to anode. Current flows through the diode-connected transistor 130 from collector to emitter and into the logic circuit 17. Although three 8 Volt Zener diodes are shown in FIG. 4, any combination of Zener diodes having a reverse-biased voltage of approximately 24 Volts may be used.

Figure 5:
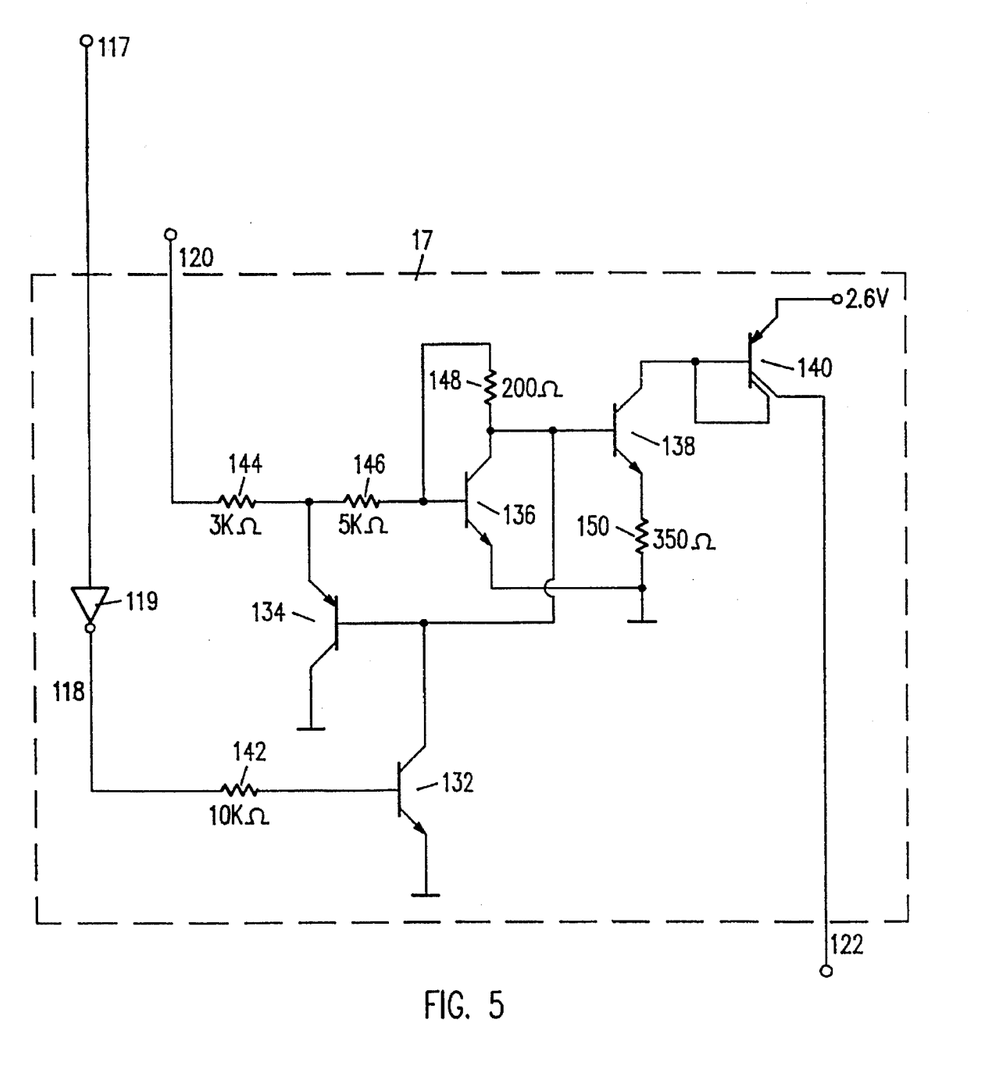
FIG. 5 is a schematic diagram illustrating a logic circuit that receives the output of the overvoltage detector shown in FIGS. 1–3.

FIG. 5 shows an example of detailed circuitry utilizable in implementing the logic circuit 17 of FIGS. 1 through 3. The logic circuit 17 causes the deactivation circuit to generate the deactivation signal in response to the switching signal and the overvoltage signal. Specifically, the logic circuit 17 includes a first npn transistor 132 that has its emitter connected to ground and its base coupled through a 10 KΩ resistor 142 to node 118 to receive the switching signal. A second npn transistor 136 has its collector coupled to its base through a 200 Ω resistor 148 and its emitter connected to ground. The base of the second npn transistor 136 is coupled to node 120 through a 5 KΩ resistor 146 and a 3 KΩ resistor 144 to receive the overvoltage signal. The collector of the first npn transistor 132 is coupled to the collector of the second npn transistor 136. Because the collectors of the first and second npn transistors 132 and 136 are connected together, the same silicon tub can be used for the two collectors. Thus, only two tubs are required to implement the first and second npn transistors 132 and 136 in silicon.

A third npn transistor 138 has its emitter coupled to ground through a 350 Ω resistor 150 and its base coupled to the collector of the second npn transistor 136. The collector of the third npn transistor 138 is coupled to the base of a first pnp transistor 140 that has two collectors. The emitter of the first pnp transistor 140 is coupled to a 2.6 Volt voltage supply. One of the two collectors of transistor 140 is coupled to its base, and the other collector is coupled to the deactivation circuit at node 122. A second pnp transistor 134 has its collector connected to ground, its emitter coupled to the node between resistors 144 and 146, and its base coupled to the collector of the first npn transistor 132.

During operation, the logic circuit 17 generates a high signal at node 122 only when the switching signal at node 117 and the overvoltage signal at node 120 both go high. Specifically, when the switching signal at node 117 goes high, the inverter 119 inverts the switching signal such that a low signal is received at the base of the first npn transistor 132 which causes it to switch off. If, at the same time, the overvoltage signal at node 120 goes high, a high signal is received at the base of the second npn transistor 136 which causes it to switch on. Current then flows through the second npn transistor 136 which causes the third npn transistor 138 to switch on. As a result, the first pnp transistor 140 switches on, causing current to flow out of node 122. If the current flowing into node 120 becomes too large, the second pnp transistor 134 switches on in order to clamp the current to an acceptable level.

When the switching signal at node 117 goes low, the inverter 119 causes a high signal to be received at the base of the first npn transistor 132 which causes it to switch on. When the first npn transistor 132 switches on, the collector of the second npn transistor 136 is effectively coupled to ground. This causes the third npn transistor 138 and the first pnp transistor 140 to switch off, which causes current to stop flowing through node 122. Similarly, when the overvoltage signal at node 120 goes low, the second npn transistor 136 switches off, which causes the third npn transistor 138 and the first pnp transistor 140 to switch off. Thus, when either the switching signal at node 117 or the overvoltage signal at node 120 goes low, the logic circuit 17 output at node 122 also goes low.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A protection circuit for a semiconductor switch utilizable for switching a load, the protection circuit comprising:

control circuitry connected to the semiconductor switch for switching the semiconductor switch on in response to a switching signal and for switching the semiconductor switch off in response to a deactivation signal;

a deactivation circuit for generating the deactivation signal;

an overvoltage detector circuit that responds to a voltage at an output of the semiconductor switch that exceeds a predetermined value by generating an overvoltage signal, the overvoltage detector circuit including,
   a resistor,
   a diode connected transistor, and
   a Zener diode having its cathode coupled through the resistor to the output of the semiconductor switch and its anode coupled to the collector of the diode-connected transistor, the overvoltage signal being generated at the emitter of the diode-connected transistor; and a first logic circuit for causing the deactivation circuit to generate the deactivation signal in response to the switching signal and the overvoltage signal, the first logic circuit including,
   a first npn transistor having its emitter connected to ground and that receives an inversion of the switching signal at its base through a resistor,
   a second npn transistor having its collector coupled to its base through a resistor, its emitter connected to ground, and that receives the overvoltage signal at its base through a resistor, the collector of the first npn transistor being coupled to the collector of the second npn transistor,
   a third npn transistor having its emitter coupled to ground through a resistor, the collector of the second npn transistor being coupled to the base of the third npn transistor,
   a first pnp transistor having two collectors, the collector of the third npn transistor being coupled to the base of the first pnp transistor, the emitter of the first pnp transistor being coupled to a positive voltage supply, a first of the two collectors being coupled to the base of the first pnp transistor, and a second of the two collectors being coupled to the deactivation circuit.

2. A protection circuit in accordance with claim 1, wherein the first logic circuit further comprises:

a second pnp transistor having its collector connected to ground, its emitter coupled to the overvoltage signal through a resistor, and its base coupled to the collector of the first npn transistor.

3. A protection circuit in accordance with claim 1, further comprising:

a current limiter circuit responsive to the overvoltage signal for limiting current that is delivered to the semiconductor switch by the control circuitry.

4. A protection circuit in accordance with claim 3, wherein the current limiter circuit comprises:

an npn transistor having its base connected to receive the overvoltage signal, its collector connected to the output of the control circuitry, and its emitter connected to ground.

5. A protection circuit in accordance with claim 1, further comprising:

a current sensor responsive to the current flowing through the semiconductor switch for generating a current sensor output signal for causing the deactivation circuit to generate the deactivation signal; and a filter for attenuating the current sensor output signal so that brief current spikes present in the semiconductor switch will not activate the deactivation circuit.

6. A protection circuit in accordance with claim 1, wherein the control circuitry comprises:

a second logic circuit which receives as inputs the switching signal and the deactivation signal generated by the deactivation circuit.

7. A protection circuit in accordance with claim 1, wherein:

the deactivation circuit comprises a flip-flop which generates the deactivation signal at an inverted output thereof; and wherein the output of the first logic circuit is connected to the input of a third logic circuit and the output of the third logic circuit is connected to the set input of the flip flop.

8. A protection circuit for a semiconductor switch utilizable for switching a load, the protection circuit comprising:

control circuitry connected to the semiconductor switch for switching the semiconductor switch on in response to a switching signal and for switching the semiconductor switch off in response to a deactivation signal;

a deactivation circuit for generating the deactivation signal;

an overvoltage detector circuit that responds to a voltage at an output of the semiconductor switch that exceeds a predetermined value by generating an overvoltage signal; and a first logic circuit for causing the deactivation circuit to generate the deactivation signal in response to the switching signal and the overvoltage signal, the first logic circuit including, transistor circuitry, coupled to receive the overvoltage signal, for providing a first current to the deactivation circuit in response to the overvoltage signal, the transistor circuitry including a substantially diode connected first transistor having a base, a collector, and an emitter for conducting a second current to be used to provide the first current to the deactivation circuit in response to the overvoltage signal, the base of the first transistor being coupled through a first resistor to receive the overvoltage signal, the collector of the first transistor being coupled to its base through a second resistor, and the emitter of the first transistor being coupled to ground; and a second transistor, coupled to receive an inversion of the switching signal, for disabling the transistor circuitry from providing the first current to the deactivation circuit by providing a conduction path from the collector of the first transistor to ground in response to the switching signal not being active, the collector of the first transistor being coupled to the second transistor.

9. A protection circuit as recited in claim 8, wherein the first transistor comprises a first npn transistor and the second transistor comprises:

a second npn transistor having a base, a collector, and an emitter, the collector of the second npn transistor being coupled to the collector of the first transistor, the emitter of the second npn transistor being coupled to ground, and the base of the second npn transistor being coupled through a third resistor to receive an inversion of the switching signal.

10. A protection circuit as recited in claim 9, wherein the transistor circuitry further comprises:

a third transistor, coupled to the deactivation circuit, for conducting the first current to the deactivation circuit in response to the first transistor conducting the second current.

11. A protection circuit as recited in claim 10, wherein the third transistor comprises:

a first pnp transistor having two collectors, an emitter, and a base, the emitter of the first pnp transistor being coupled to a voltage supply, a first of the two collectors being coupled to the base of the first pnp transistor, and a second of the two collectors being coupled to the deactivation circuit.

12. A protection circuit as recited in claim 10, wherein the transistor circuitry further comprises:

a fourth transistor, coupled to the first and third transistors, for switching the third transistor into a conducting state in response to the first transistor conducting the second current.

13. A protection circuit as recited in claim 12, wherein the fourth transistor comprises:

a third npn transistor having a base, a collector, and an emitter, the collector of the third npn transistor being coupled to the third transistor, the emitter of the third npn transistor being coupled through a fourth resistor to ground, and the base of the third npn transistor being coupled to the first and second transistors.

* * * * *